United States Patent [19]

Frye et al.

[11] Patent Number: 4,593,405

[45] Date of Patent: Jun. 3, 1986

[54] LOUDSPEAKER SYSTEM WITH COMBINATION CROSSOVER AND EQUALIZER

[75] Inventors: Kent Frye, Buchanan, Mich.; Gary T. Ewald, South Bend, Ind.

[73] Assignee: Electro-Voice, Incorporated, Buchanan, Mich.

[21] Appl. No.: 613,566

[22] Filed: May 24, 1984

[51] Int. Cl.[4] .............................................. H03G 5/00

[52] U.S. Cl. ...................................... 381/99; 381/103

[58] Field of Search ......................... 381/99, 100, 103; 333/132, 133

[56] References Cited

U.S. PATENT DOCUMENTS

| | | | |
|---|---|---|---|
| 4,282,402 | 8/1981 | Liontonia | 381/99 |
| 4,348,552 | 9/1982 | Siccone | 381/99 |
| 4,410,063 | 10/1983 | Yasue et al. | 381/99 |

FOREIGN PATENT DOCUMENTS 57-113693 7/1982 Japan .

*Primary Examiner*—Forester W. Isen

*Attorney, Agent, or Firm*—Burmeister, York Palmatier, Hamby & Jones

[57] ABSTRACT

A crossover network with a parallel resonant circuit in the high frequency branch is utilized to drive two loudspeakers, one in a low frequency range, and the other in the high frequency range. The resonant frequency of the resonant circuit lies in the upper end of the high frequency portion of the loudspeaker response.

9 Claims, 4 Drawing Figures

LOUDSPEAKER SYSTEM WITH COMBINATION CROSSOVER AND EQUALIZER

The present invention relates generally to loudspeaker systems and particularly to loudspeaker systems employing at least two electromagnetic loudspeakers for reproducing sound in different portions of the audible range interconnected by a crossover network.

It has proven difficult to provide a loudspeaker system for covering the audible range of frequencies with fidelity which employs but a single loudspeaker. The conventional loudspeaker utilizes an electromagnetic driver and a cone for coupling mechanical motion to the air, and such loudspeakers have greater efficiency at low frequencies with large cones, but do not break up as readily at high frequencies with smaller cones, thus making it desirable to use at least two such loudspeakers in a sound system.

It has also been known that it is desirable to impress only electrical signals on such a loudspeaker having frequencies in the range which the loudspeaker is designed to reproduce and to exclude electrical signals of other frequencies. For this purpose, crossover networks are provided between the audiopower amplifier and the loudspeakers to limit the electrical signals on a given loudspeaker to the frequency range which that loudspeaker is designed to reproduce.

Various types of crossover networks have been used prior to the present invention. U.S. Pat. No. 4,074,070 of Harry Gaus entitled SUPERSONIC SIGNAL LINEARIZES LOUDSPEAKER OPERATION discloses T-shaped filters employing inductances and capacitors. U.S. Pat. No. 4,198,540 of Fred R. Cizek entitled COMPENSATED CROSSOVER NETWORK discloses resistor-inductor-capacitor circuits connected in series across the voice coil of a loudspeaker. U.S. Pat. No. 4,237,340 of Paul W. Klipsch entitled CROSSOVER NETWORK FOR OPTIMIZING EFFICIENCY AND IMPROVING RESPONSE OF LOUDSPEAKER SYSTEM discloses the use of autotransformers in crossover networks.

One of the difficulties experienced when using multiple electromagnetic loudspeakers with a crossover network is to provide a smooth transition from the low frequency speaker to the higher frequency speaker at the crossover frequency. It is desirable that the crossover network provide each speaker with full current at frequencies at which the loudspeaker is to function and that the current drop off sharply for frequencies outside of the range of the loudspeaker. It is one of the objects of the present invention to provide a crossover network which achieves a very sharp drop-off in current to a speaker for frequencies outside of the design range of that speaker.

Many loudspeaker systems employ three or more loudspeakers and a crossover network in order to cover the audible range desired. Those loudspeaker systems which employ ony two loudspeakers generally experience a volume roll-off at the higher end of the frequency range due to inefficiency of the higher frequency loudspeaker. In the alternative, the crossover frequency may be made higher than the roll-off frequency of the low frequency speaker producing a drop in the acoustical energy at the crossover frequency. It is an object of the present invention to provide a loudspeaker system using two loudspeakers, a woofer for the lower portion of the frequency range and a mid-range to high range loudspeaker for the higher portion of the frequency range in which a crossover network is utilized to produce accentuated acoustical energy in the upper portion of the high frequency range without producing a loss of energy at the crossover frequency.

Loudspeakers are electromechanical devices, and as such present impedances to the driving audio power amplifier which are affected by the mechanical properties of the loudspeaker, particularly in an electromagnetic loudspeaker. The mechanical properties of the loudspeaker may be compensated by the use of filter networks between the audio amplifier and the loudspeaker. U.S. Pat. No. 3,061,676 to J. L Wirth entitled SOUND REPRODUCING DEVICE, and U.S. Pat. No. 3,988,541 to Warren B. Borst entitled METHOD AND APPARATUS FOR FREQUENCY COMPENSATION OF ELECTROMECHANICAL TRANSDUCER are examples of devices in which the electrical circuits are designed to complement the frequency characteristics of the mechanical response parameters of the loudspeaker. It is an object of the present invention to provide a crossover network which shapes the electrical output impressed upon a speaker to complement the frequency characteristic of the mechanical response parameters of that speaker.

The foregoing objects of the present invention result in a loudspeaker system covering a large portion of the audible response range with only two loudspeakers and with improved frequency response characteristics. In addition, by incorporating the electrical elements necessary to shape the driving signals to the electromagnetic loudspeakers in the crossover network, the inventor has achieved a reduction in the electrical components required and a corresponding economical solution to a loudspeaker system.

The foregoing objects of the present invention are accomplished by providing a loudspeaker system with two electromagnetic loudspeakers, one functioning at the low frequency end of the response range and the other functioning at the high frequency end of the response range. The two loudspeakers are adaped to be driven from a common amplifier through a crossover network which includes a coil and condenser connected in parallel coupled across the terminals of the high frequency loudspeaker, thus producing a parallel resonant circuit with a resonant frequency in the upper end of the higher frequency portion of the loudspeaker response. The higher frequency portion of the frequency response range is established by the cutoff frequency of the filter.

The present invention will be more fully described in relation to the accompanying drawings, in which.

Figure 1:
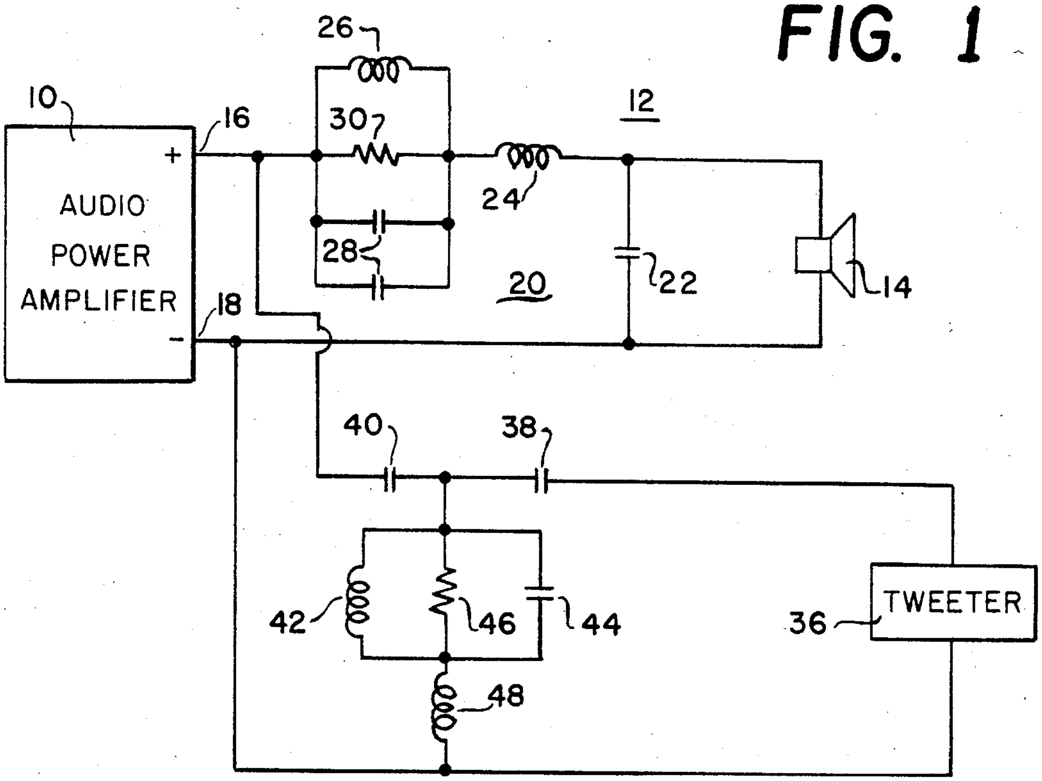
FIG. 1 is a schematic electrical diagram of a loudspeaker system according to the present invention coupled to the output of an audio power amplifier.
Figure 3:
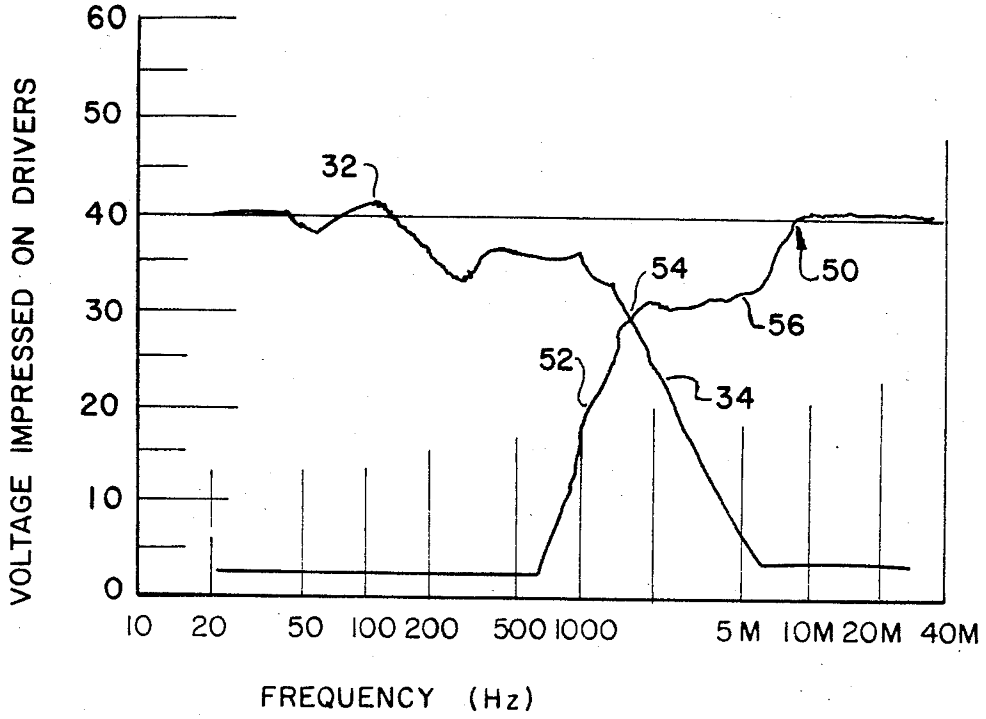
FIG. 3 is a graph illustrating the output voltages of the crossover network impressed upon the lower frequency loudspeaker and the high frequency loudspeaker of FIG. 1.

In FIG. 1, an audio power amplifier 10 is illustrated connected to a loudspeaker system 12. The loudspeaker system 12 has a woofer 14 connected to the output terminals 16 and 18 of the audio amplifier 10 through a coupling network 20. The coupling network 20 has a conventional L-filter consisting of a capacitor 22 and a choke 24 for purposes of providing a high frequency cutoff for the driving signals from the audio power amplifier 10. The impedance of the capacitor 22 falls with increased frequency, hence reducing the potential across the input terminals of the woofer 14 with increased frequency, and the impedance of the choke 24 increases with frequency, thus further reducing the potential across the input terminals of the woofer 14. A coil 26 connected in parallel with a pair of condensers 28 and a resistor 30 is connected between the choke 24 and the output terminal 16 of the audio amplifier 10. The coil 26 and condensers 28 form a parallel resonant circuit and the resonance of the circuit is selected to correspond to the cutoff frequency of the crossover network. At resonance, the impedance across the choke and condensers reaches a high value, this value being somewhat lowered by the resistor 30 and the resonance being broadened by the resistor 30. As a result, the power delivered to the terminals of the loudspeaker 14 falls off sharply at the cutoff frequency. FIG. 3 illustrates the curve of voltage applied to the loudspeaker 14 throughout the frequency response range of the loudspeaker system, this curve being generally designated 32, and the declining portion of the curve 32 is shown at 34.

The loudspeaker system also has a tweeter 36 which has one input terminal connected to the terminal 16 of the audio amplifier 10 through two serially connected condensers 38 and 40. The other input terminal of the loudspeaker 36 is directly connected to the output terminal 18 of the audio amplifier. A choke 42 is connected in parallel with a condenser 44 and a resistor 46, thus forming a parallel resonant circuit, and this parallel resonant circuit is connected in series with a choke 48 and coupled across the input terminals of the high frequency loudspeaker 36 through the condenser 38. While each element of the circuit coupling the high frequency speaker 36 to the audio power amplifier 10 provides an impedance contribution which must be separately determined throughout the response range of the high frequency loudspeaker 36, certain generalizations may be made. The coil 42 and condenser 44 are resonant at a frequency significantly above the crossover frequency, and hence at the crossover frequency, the impedance across the coil 42 and condencer 44 is relatively low. As a result, the coupling circuit between the high frequency speaker 36 and the audio power amplifier 10 at the crossover frequency may be viewed as a T-filter consisting of the capacitors 38 and 40 and the choke 48, thus producing an increase in voltage on the input terminals of the speaker 36 as the frequency rises above the crossover frequency. FIG. 3 illustrates the potential applied to the input terminals of the high frequency speaker 36 at 50 and the sharply rising portion of the curve near the crossover frequency at 52. It will be noted that the voltage impressed on the woofer 14 equals the voltage impressed upon the tweeter 36 at the crossing of the curves 32 and 50, this point being designated 54 and referred to as the crossover frequency.

The coil 42 and condenser 44 have a resonance at a frequency above the crossover frequency 54 but below the upper frequency limit of the loudspeaker system. The resonant frequency of the coil 42 and condenser 44 is damped by the resistor 46 to provide a relatively broad resonance, and in the particular construction, this resonant frequency is selected to be approximately 8,000 Hz. FIG. 3 illustrates a sharp rise in the voltage applied to the high frequency speaker 36 in this region, designated 56 in FIG. 3, since at resonance, the parallel coil 42/condenser 44 circuit presents a very high impedance across the input terminals of the high frequency loudspeaker 36. The result of the sharp rise in voltage on the input terminals of high frequency loudspeaker 36 at the resonant frequency of the coil 42/condenser 44 causes an increase in the acoustical output of the high frequency loudspeaker 36 in this portion of the frequency response of the loudspeaker system.

Figure 2:
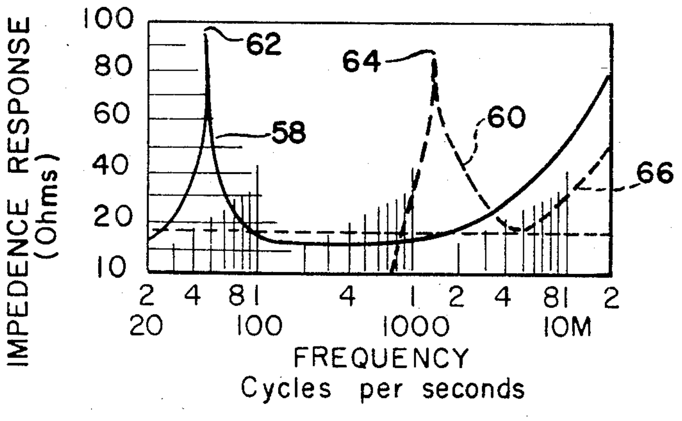
FIG. 2 is a graph showing the impedance of the low frequency and high frequency loudspeakers of the loudspeaker system of FIG. 1 throughout the frequency response range of the loudspeaker system.

FIG. 2 illustrates the curve of impedance versus frequency for the low frequency speaker 14 and high frequency speaker 36, the low frequency speaker curve being designated 58 and the high frequency loudspeaker curve being designated 60. Both curves 58 and 60 show sharp peaks 62 and 64, respectively, which correspond to the mechanical resonance of the loudspeakers at the lower end of the response range of that loudspeaker. The acoustical output for a given electrical signal is maximum at the frequency of the peak 62 or 64 for the loudspeakers 14 and 36, respectively, and must be damped either electrically or acoustically. The peak 62 of loudspeaker 14 is damped acoustically by designing the enclosure for the loudspeaker system to flatten the acoustical response at that frequency. The peak 64 of the loudspeaker 36 is made to occur in the rapidly rising portion 52 of the voltage curve 50 for the signal applied to the high frequency loudspeaker 36, thereby damping the peak electrically.

Both loudspeakers 14 and 36 become inefficient at the high frequency end of their response ranges. The low frequency loudspeaker 14 is efficient to the cutoff frequency or transition frequency 54 and is not utilized above that frequency due to the cutoff of the crossover network. The high frequency loudspeaker 36 is utilized to the upper limit of its acoustical response range, even though the loudspeaker 36 becomes inefficient as indicated by the rapid rise in impedance in the upper portions of its reponse range as indicated at 66 in FIG. 2. The sharp rise in voltage applied to the input terminals of the high frequency loudspeaker 36 at the resonant frequency of the coil 42/condenser 44 circuit, indicated at 56 of FIG. 3, extends the useful high frequency range of the high frequency loudspeaker 36 and thus extends the high frequency upper limit of the loudspeaker system.

In one particular construction of the present invention, the low frequency loudspeaker 14 is an electromagnetic loudspeaker with a 15 inch cone having a mechanical resonance at about 50 Hz. The loudspeaker 14 is designed to produce acoustical output up to approximately 1,500 Ha., the crossover frequency of the crossover network. The high frequency loudspeaker 36 is an electromagnetic horn loudspeaker having a mechanical resonance at approximately 1,200 Hz. The coil 42 and condenser 44 are resonant at a frequency of approximately 8,000 Hz. The specific values of the components in the crossover network in this construction are as follows:

| | | |
|---|---|---|
| Condenser 22 | 12 | microfarads |
| Choke 24 | 3.25 | millihenrys |
| Coil 26 | 1.3 | millihenrys |
| Condensers 28 | 90 | microfarads |
| Resistor 30 | 20 | ohms |

-continued

| | |
|---|---|
| Condenser 38 | 2 microfarads |
| Condenser 40 | 5 microfarads |
| Coil 42 | 1.0 millihenrys |
| Condenser 44 | 2.8 microfarads |
| Resistor 46 | 20 ohms |
| Choke 48 | 0.26 millihenrys |

Figure 4:
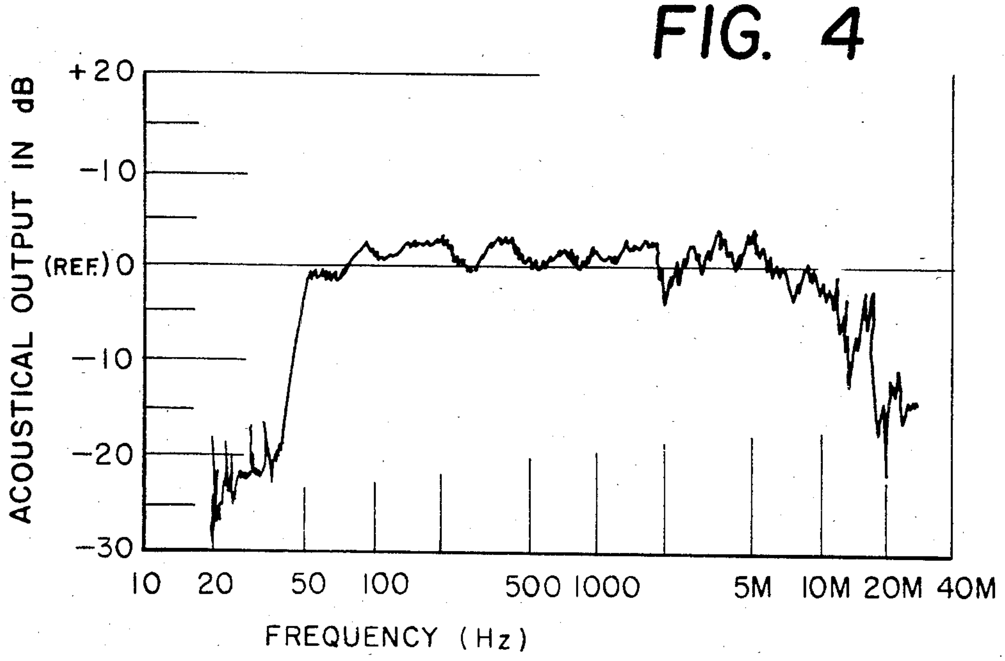
FIG. 4 is a graph illustrating the frequency response curve for the acoustical output of the loudspeaker system of FIG. 1.

As thus constructed, the loudspeaker system produced an audio frequency response as illustrated in FIG. 4 covering the frequency range of approximately 50 Hz. through 17,000 Hz.

Those skilled in the art will devise many applications and uses beyond that herein disclosed for the present invention. It is therefore intended that the scope of the present invention be not limited by the foregoing specification, but rather only by the appended claims.

The invention claimed is:

1. A multiple loudspeaker system for reproducing audio signals over a frequency response range comprising a first input terminal and a second input terminal, a first electromagnetic loudspeaker adapted to produce sounds in the portion of the audible range below a transition frequency having two inputs electrically connected to the first and second input terminals, a second electromagnetic loudspeaker adapted to produce sounds in the portion of the audible range above said transition frequency and having two inputs, said second loudspeaker having a mechanical resonance at a frequency approximately equal to the transition frequency, and a coupling network electrically connected between the first and second input terminals and the inputs of the second loudspeaker characterized in that the coupling network includes a resonant circuit and a filter, the filter having a low impedance coupled across the second loudspeaker for frequencies below the frequency of mechanical resonance of the second loudspeaker and a high impedance above the frequency of mechanical resonance of the second loudspeaker, and the resonant circuit being coupled across the inputs of the second loudspeaker and having a high impedance at resonance, said resonant circuit being electrically resonant at a frequency in the sound range of the second loudspeaker above the frequency of the mechanical resonance of the second loudspeaker.

2. A multiple loudspeaker system comprising the combination of claim 1 wherein the resonant circuit comprises a coil and a condenser connected in parallel.

3. A multiple loudspeaker system comprising the combination of claim 1 wherein the coil and condenser are coupled to the inputs of the second loudspeaker through a choke.

4. A multiple loudspeaker system for reproducing audio signals over a frequency response range comprising a first input terminal and a second input terminal, a first electromagnetic loudspeaker adapted to produce sounds in the portion of the audible range below a transition frequency having two inputs electrically connected to the first and second input terminals, a second electromagnetic loudspeaker adapted to produce sounds in the portion of the audible range above said transition frequency and having two inputs, and a coupling network electrically connected between the first and second input terminals and the inputs of the second loudspeaker characterized in that the coupling network includes a resonant circuit having a high impedance at resonance coupled across the inputs of the second loudspeaker, said resonant circuit being electrically resonant at a frequency in the sound range of the second loudspeaker above the transition frequency, the coupling network having a second condenser and a third condenser connected in series between the one input terminal and one of the inputs of the second loudspeaker, the resonant circuit being connected to the junction of the second and third condensers and coupled to the other input of the second loudspeaker.

5. A multiple loudspeaker system comprising the combination of claim 4 wherein a choke is connected between the resonant circuit and the other input of the second loudspeaker.

6. A multiple loudspeaker system comprising the combination of claim 1 in combination with a low pass filter connected between the input terminals and the first loudspeaker, the low pass filter having a cut off frequency in the lower portion of the frequency response range of the second loudspeaker.

7. A multiple loudspeaker system comprising the combination of claim 6 wherein the low pass filter comprises a second choke connected between one of the inputs of the first loudspeaker and the first input terminal and a fourth condenser connected across the inputs of the first loudspeaker.

8. A multiple loudspeaker system for reproducing audio signals over a frequency response range comprising a first input terminal and a second input terminal, a first electromagnetic loudspeaker adapted to produce sounds in the portion of the audible range below a transition frequency having two inputs electrically connected to the first and second input terminals, a second electromagnetic loudspeaker adapted to produce sounds in the portion of the audible range above said transition frequency and having two inputs, and a coupling network electrically connected between the first and second input terminals and the inputs of the second loudspeaker, said coupling network being characterized in that the coupling network includes a resonant circuit having a high impedance at resonance coupled across the inputs of the second loudspeaker, said resonant circuit being electrically resonant at a frequency in the sound range of the second loudspeaker above the transition frequency, said coupling network including a second resonant circuit having a high impedance at resonance connected in series between one of the input terminals and the first loudspeaker, said second resonant circuit having a resonant frequency approximately at the transition frequency.

9. A multiple loudspeaker system comprising the combination of claim 8 wherein the second resonant circuit comprises a coil and a condenser connected in parallel between the one input terminal and the second choke.

* * * * *